(12) United States Patent
Dimer et al.

(10) Patent No.: US 8,669,463 B2
(45) Date of Patent: Mar. 11, 2014

(54) METHOD FOR DEPOSITING A TRANSPARENT CONDUCTIVE OXIDE (TCO) FILM ON A SUBSTRATE AND THIN-FILM SOLAR CELL

(75) Inventors: Martin Dimer, Dresden (DE); Tina Schoessler, Dresden (DE); Thomas Knoth, Dresden (DE); Ralf Sturm, Dresden (DE); Uwe Graupner, Dresden (DE); Martin Thumsch, Dresden (DE); Hans-Christian Hecht, Weinböhla (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 631 days.

(21) Appl. No.: 12/909,266

(22) Filed: Oct. 21, 2010

(65) Prior Publication Data
US 2011/0108105 A1    May 12, 2011

(30) Foreign Application Priority Data
Oct. 21, 2009 (DE) .......................... 10 2009 050 234

(51) Int. Cl.
*H01L 31/00* (2006.01)
*C23C 16/00* (2006.01)

(52) U.S. Cl.
USPC ....................... 136/252; 427/255.23; 427/299

(58) Field of Classification Search
USPC .......................................................... 136/256
See application file for complete search history.

(56) References Cited

U.S. PATENT DOCUMENTS

| | | | |
|---|---|---|---|
| 5,078,803 A * | 1/1992 | Pier et al. ........................ | 136/256 |
| 2005/0016583 A1* | 1/2005 | Blieske et al. ................. | 136/256 |
| 2005/0082629 A1 | 4/2005 | Murakami | |
| 2006/0169317 A1 | 8/2006 | Sato et al. | |
| 2007/0082140 A1 | 4/2007 | Suzuki et al. | |
| 2007/0228369 A1 | 10/2007 | Suzuki et al. | |
| 2009/0120496 A1 | 5/2009 | Cording et al. | |
| 2009/0126791 A1 | 5/2009 | Lu et al. | |

FOREIGN PATENT DOCUMENTS

| | | |
|---|---|---|
| EP | 1624494 A1 | 2/2006 |
| EP | 2314732 B1 | 3/2013 |
| JP | 2007231361 A | 9/2007 |
| WO | 2005072946 A1 | 8/2005 |
| WO | 2009117083 A2 | 9/2009 |

OTHER PUBLICATIONS

Hong, Jae-Suk, Enhanced properties of In2O3 thin films deposited on soda lime glass due to barrier layers of SiO2 and TiO2, Science Direct, Thin Solid Films 467, 2004, pp. 158-161.

* cited by examiner

*Primary Examiner* — Miriam Berdichevsky
(74) *Attorney, Agent, or Firm* — Heslin Rothenberg Farley & Mesiti P.C.

(57) ABSTRACT

A method is provided for depositing a transparent conductive oxide (TCO) layer on a substrate, in which contaminations of the layers of the layer system is reduced through the diffusion of material from the substrate, and whose layer properties in respect to coupling and transmission of light are optimized. For that purpose, a barrier layer, a seed layer and a transparent conductive oxide layer are directly successively deposited on the substrate. Also, a thin-film solar cell is described which comprises such a transparent conductive oxide layer.

8 Claims, 3 Drawing Sheets

# METHOD FOR DEPOSITING A TRANSPARENT CONDUCTIVE OXIDE (TCO) FILM ON A SUBSTRATE AND THIN-FILM SOLAR CELL

CROSS REFERENCE TO RELATED APPLICATIONS

This application claims priority of German application No. 10 2009 050 234.3 filed on Oct. 21, 2009, the entire disclosure of which is hereby incorporated herein by reference.

BACKGROUND OF THE INVENTION

The invention refers generally to a method for coating a substrate with a transparent conductive oxide layer, in the following designated as TCO layer, as well as a thin-film solar cell.

The coating takes place on a substrate using physical vapor deposition (PVD method), usually through sputtering in a in-line method at which the substrate is moved through a coating chamber, and is then coated. For the sputtering, the substrate is moved passed a cathode assembly as coating source which has a target of the material that is to be deposited. Into the coating chamber, a working gas is introduced which has added a small amount of hydrogen or other gases in comparison to the working gas.

Such conductive and transparent TCO layers can be used in various applications and in particular in the UV and in the IR range because of their optical properties, e.g. as a transparent electrode in thin-film solar cells or in flat screens, as a blocking layer in a selective layer system for glass, or as a IR reflection layer. In respect to these different applications, various other substrates can also be considered, e.g. glass, silicon or metallic substrates.

It is known, to manufacture transparent conductive oxide layers from various metal oxide layers (Transparent Conducting (Metal) Oxide—TCO) which due to their doping with material from the third group of the Periodic Table of Elements, e.g. aluminium, indium, gallium or boron have the required conductivity. Also through dopings with flourine, yittrium or magnesium, the desired electrical properties are attained. Well known are for instance doped layers of indium oxide, tin oxide or indium tin oxide (ITO) wherein layers of tin oxide become more important as they are manufactured significantly cheaper, are non-toxic, easy to dope, and durable within a hydrogenous atmosphere.

The coating takes place in a vacuum coater which dependent on the layers or layer systems that are to be deposited have one or more coating chambers. Serving as the target is a ceramic metal oxide target which is doped to adjust the low specific surface resistance of the layer as described for both the optical and the electrical properties required, e.g. the doping takes place by enhancement of the target material with aluminium oxide in the single-digit percents by weight. Such a layer material is known as ZnO:Al or AZO. Also, reactive or partly reactive sputtering techniques can be used.

Besides the target material, the sputtering atmosphere and other process parameters such as pressure, also partial pressure of various components of the working gas, and temperature in particular the substrate temperature, or power input also have an impact on the transparency and the specific surface resistance of the deposited layer.

It is therefore described that through the introduction of hydrogen into the argon atmosphere of the coating chamber to produce an argon-hydrogen plasma, the conductivity of the layer and the reflection in the IR range is increased with a continuously good transmission in the visible range. However with adding the hydrogen, a regular decrease of the deposition rate is observed which presents itself as a disadvantage for an efficient coating on a large scale in continuous operation systems. Additionally, the realization of the high frequency magnetron sputter (RF sputtering) of doped ZnO causes problems in regards to stability of the process, and thus, the layer homogeneity and in regards to the deposition rate. Also, the coating using direct current voltage sputtering, i.e. by means of a pulsed input of the electrical power in the cathode assembly with frequencies in the range of 3 to 50 MHz is used.

The substrate temperature is adjusted by a plane-like heating of the substrate before the coating procedure by taking into consideration the energy input during the coating. The substrate is mostly heated to 100° C. plus, wherein only with significantly higher temperatures of approximately 200-300° C., acceptable surface resistance values of the deposited layer are attained.

In particular through the temperature loading during the coating process, an outward diffusion of material from the substrate in the to be deposited or already deposited layer is however supported. The deposition of a barrier layer is a common method to avoid a contamination of the active layers through material diffusing from the substrate outwards.

For the use in thin-film solar cells, in which the TCO layer is used as a transparent, electrical surface contact which is passed by the incident light, besides a high transparency and a good electrical conductivity of the contact layer, good diffusing properties are required. If this surface contact is arranged on the side of the incident light of a solar cell, a high light incidence is possible on the one hand, and on the other hand, a certain extent of light scattering in the layer is beneficial to improve the light coupling in the absorbing semi-conductor. Through multiple scattering it shall be achieved that the incident light in the layer system travels as long a distance as possible to increase the absorption proportion in the photoactive layer. In particular, total reflections of the incident light are to be inhibited. For a better coupling of the light in the layer system, the TCO layer at its borders toward the photoactive layer is also provided with a roughened surface.

To achieve exactly that, a sequence of various layers is regularly deposited. It is known in particular for the manufacturing of a roughened by PVD generated, following the deposition at first smooth, TCO layer is subsequently roughened using an etching process, however without changing the transmission properties or the electrical conductivity significantly.

SUMMARY OF THE INVENTION

A method for coating a substrate with a transparent conductive oxide layer is described for which the contamination of layers of the layer system is reduced through diffusion of material from the substrate, and whose layer properties in regards to light coupling and transmission are optimized. For this purpose, a barrier layer, a seed layer and a transparent conductive oxide layer (TCO layer) are directly successively deposited on the substrate. Also, a thin-film solar cell is described which comprises such a transparent conductive oxide layer.

According to the method as in the invention for coating a substrate with a transparent conductive oxide layer, which here is also designated as TCO layer, the layers, barrier layer, seed layer and TCO layer, whose functioning are explained subsequently, are directly successively deposited on a substrate using a physical vapor deposition. At first, a barrier layer is applied on the substrate. This barrier layer serves to prevent diffusing material from the substrate toward the on top deposited layers of the respective layer system, and thus, the prevention of an unwanted contamination of the TCO layer and subsequent layers. The barrier layer protects also in particular the photoactive, semi-conductive layers against a faulty doping and the associated dysfunction of the electrical and optical properties of these layers.

Following the barrier layer, a seed layer is deposited whose purpose is to set a certain layer growth for the subsequent TCO layer, and thus, to crucially influence the morphological, electrical and optical properties of this TCO layer.

On this seed layer, a TCO layer is deposited immediately following which in this way benefits directly from the underlying seed layer in regards to its layer properties.

In respect to a particular embodiment of the method, a barrier layer is used which consists of a silicon oxynitride (SiOxNy), silicon oxide (SiOx) or silicon nitride (SixNy) with $0<x\leq3$ and $0<y\leq4$. The barrier layer affects the substrate by preventing diffusions from the substrate into the layer sequence, and thus, effects founded thereon on the layer properties. Due to choice and adjustment of the process parameters for the manufacturing of this layer, the barrier effect against the present material, and the expected influence through the substrate of the material are adjusted. With a barrier effect adjustable in this way, a diffusion of material from the substrate toward the TCO layer can effectively be prevented or at least reduced in order of magnitude. In this way, for instance, through a high content of nitrogen, the barrier effect against sodium ions from a glass substrate is amplified.

The barrier effect of the barrier layer can thereby specifically be adjusted through the process parameter relation of the reactive gas components oxygen and nitrogen to each other, and/or through the pressure and/or the temperature during the deposition of the barrier layer, wherein this mention shall not be taking effect exclusively. Additionally, a thicker, under the same conditions deposited barrier layer increases of course also the barrier effect.

The kind as well as the deposition conditions of the seed layer can in turn be chosen in a way that the layer growth of the subsequent to the seed layer deposited TCO layer is influenced to the extent that this TCO layer reaches a desired, at best a maximum haze value with a lowest possible surface resistance.

The haze value marks thereby the quality of the roughness and/or the light scattering properties of the TCO layer. A high haze value means a high level of light scattering which respectively can be determined experimentally. The adjustment of a highest possible haze value serves therefore the optimizing of the efficiency for the transformation of light incidence into electrical power.

Deposition conditions are considered as well as the process parameter of the deposition such their timing. In this way, it is explicitly permitted that in respect to a particular embodiment of the method, single process parameters during the course of the deposition of the seed layer are not held constant but are systematically and reproducibly varied. As a criterion for a check, the haze value of the TCO layer deposited on the respective seed layer as well as its surface resistance are always considered.

By means of multivariate methods of analysing, the determination of the optimal deposition conditions are thereby possible with a simultaneous check of several process parameters.

Because a direct connection between the haze value of a TCO layer defined thickness as well as the morphology of this TCO layer has been identified, the morphology of the TCO layer as one of the main influencing factors on the haze value can be considered for the determination of the most optimal deposition conditions of the seed layer below the TCO layer. The TCO layers deposited according to the invention normally have a column growth that extends over the entire thickness of the layer, wherein the lateral crystallite size of the crystallite columns in the TCO layer depending on the deposition conditions of the seed layer can vary greatly. For higher haze values, it has proven to be beneficial to choose the kind of seed layer as well as its deposition conditions so that a maximum lateral crystallite size of the TCO layer on the seed layer is attained.

In one embodiment of the method according to the invention, the thereby described properties of the subsequently deposited TCO layer are optimized in a way that with the deposition of the seed layer the growth phases, i.e. phases during which the process parameters are chosen so that the thickness of the seed layer efficiently increases, alternate with resting phases, i.e. phases during which the process parameters are chosen in a way that the thickness of the seed layer remains constant, and/or re-sputtering phases, i.e. phases during which the process parameters are chosen in a way that thickness of the seed layer decreases efficiently. In this way, a certain treatment of the growth front of this layer is achieved.

Because of the connection between morphology of the TCO layer and the seed layer, the process parameters for depositing the TCO layer are variable on a large scale so that the desired transmission and electrical properties are also affected by the choice of a seed layer beneficial for that: the system consisting of a barrier layer, seed layer and TCO layer for influencing the properties of the TCO layer contains of a greater number of degrees of freedom than a system that only consists of a barrier layer and TCO layer. Also, that allows in particular the deposition of a ceramic, doped metal oxide target.

In respect to another embodiment, the seed layer can be made of the same or similar material as provided for the barrier layer. Therefore, it is possible to deposit a SiOxNy or a SiOx or a SixNy layer with $0<x\leq3$ and $0<y\leq4$ as a seed layer.

As this layer is deposited complementing the actual barrier layer and serves primarily the adjustment of the layer properties of the TCO layer, the barrier effect of the seed layer is subordinate. Normally, the strength of the barrier effect of the seed layer differs from the effect of the barrier layer. The barrier effect of the seed layer must therefore not be reduced in comparison to the barrier effect of the barrier layer. Nevertheless, this seed layer can however develop an additional barrier effect, and thus, support the barrier layer.

In one embodiment of the coating method, both between the substrate and the TCO layer arranged layers can therefore consist of the mentioned silicon containing oxide and/or nitride materials, wherein the seed layer in comparison to the barrier layer is attained through a depletion or enhancement of the oxygen level of SiOxNy or SiOx, and complementing or alternatively, through a depletion or enhancement of the nitrogen level of SiOxNy or SixNy taking in consideration the specification of the levels to the areas of $0<x\leq3$ and $0<y\leq4$. In a special instance, both layers can consist of the same material, and differ solely by the respective deposition conditions.

In a specific version of the deposition of the seed layer, the properties of the subsequent TCO layer can thereby be adjusted during the deposition of the seed layer through the choice of following process parameters: ratio of the reactive gas components oxygen and nitrogen and/or ratio of the reactive gas components to sputtering components and/or pressure and/or temperature.

For instance for the manufacturing of the seed layer, the oxygen level in comparison to the barrier layer can be depleted and/or the nitrogen level enhanced.

For an increase of the light scattering properties of the TCO layer, and thus, of the haze values at a constant transparency and constant surface resistance, in an advantageous embodiment of the method, the surface of the TCO layer following the deposition is roughened and/or textured through an additional etching step.

Complementary for the adjustments of the surface texture of the TCO layer, the etching parameters, in particular the etchant, the etching duration and the etching temperature can be adapted to the used seed layer, or in reverse, the seed layer can be chosen in a way that an additional etching step following the deposition of the TCO layer can have a particularly beneficial effect on the haze value of the layer at a similar transparency and surface resistance.

The thin-film solar cell according to the invention, which with the help of the presently described method can be manufactured, consists of a on a transparent substrate arranged layer system which contains following layers from the substrate directly succeeding upwards: A barrier layer to prevent a material affecting one of the on top lying layers of the thin-film solar cell, in particular their photoactive layers which can take place through diffusion of material from the substrate; a seed layer made from a material which is suitable to generate a certain layer growth for a on the seed layer deposited TCO layer, a TCO layer as a first contact layer; a photoactive layer stack and a counter-contact as a second contact layer. Thus, it offers a particularly simple construction.

It is emphasized thereby that the thin-film solar cell constructed in such a way can be used for both a light incidence from the substrate side and from the counter-contact side. For a light incidence from the substrate side it is a condition that both the barrier layer and the seed layer have a sufficient transparency to transfer most of the from the substrate side incident light toward the TCO layer and photoactive layer stack.

In a beneficial embodiment of the thin-film solar cell according to the invention, the TCO layer thereby has a distinct column-like crystallite structure. That makes a particularly beneficial light scattering possible which is reflected by a high haze value of this TCO layer without the surface resistance of the TCO layer being significantly changed, in particularly significantly increased.

In another embodiment of the thin-film solar cell, the TCO layer has a textured and/or roughened surface that again contributes to the increase of the haze value which as already mentioned can be determined experimentally.

Using simple means, a thin-film solar cell can be manufactured at which the barrier layer consists of a SiOxNy or SiOx or SixNy with 0<x≤3 and 0<y≤4 with a high-level barrier effect against the diffusion of material from the substrate. The deposition of silicon-containing oxide and/or nitride materials is possible through various, known, simple and easy-to-control PVD methods. The manufacturing of the thin-film solar cell according to the invention can be further simplified if silicon-containing oxide and/or nitride materials are used for the seed layer so that this layer consists of SiOxNy or SiOx or SixNy layer with 0<x≤3 and 0<y≤4. Thereby, the barrier layer is optimized to the desired barrier effect while the seed layer is optimized to the morphological, electrical and optical properties of the TCO layer deposited on the seed layer. Thereto, the deposition conditions of the seed layer in comparison to the ones of the barrier layer are changed through choosing different process parameters, or choosing a respective course of these process parameters. Generally, it is possible that the seed layer of the thin-film solar cell according to the invention in a special embodiment has a gradual and/or abrupt change of its layer properties.

Of course, it is highly possible that only the seed layer consists of a silicon containing oxide and/or nitride material.

BRIEF DESCRIPTION OF THE DRAWINGS

The invention shall be explained in more detail using embodiments of two etched TCO layers. For that purpose

DETAILED DESCRIPTION OF THE INVENTION

Figure 1A:
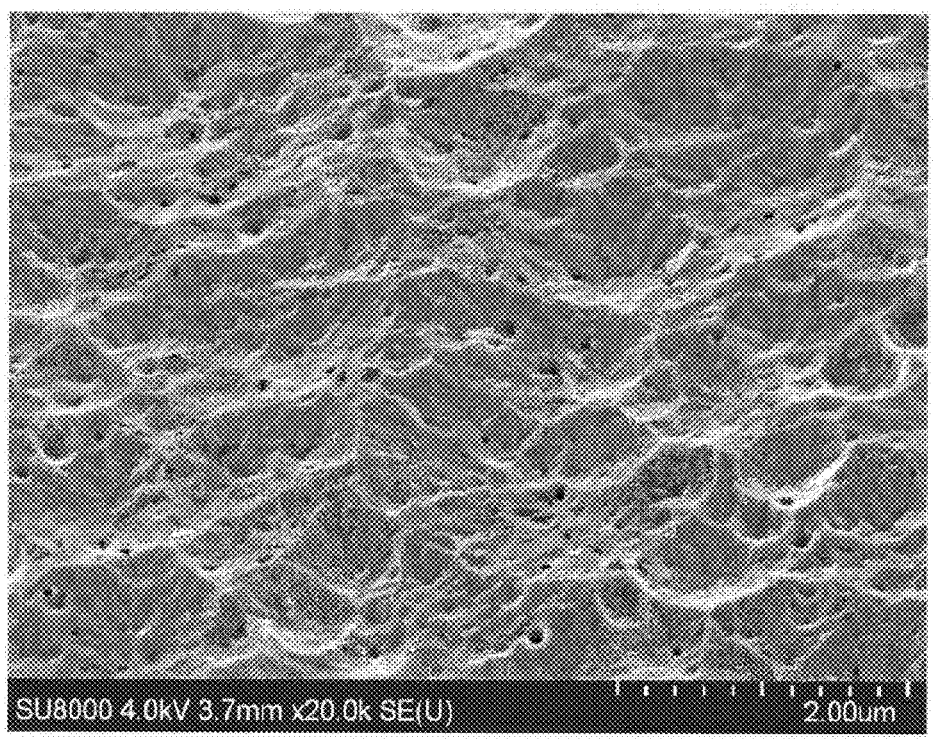
FIG. 1a presents the surface of a first TCO layer with 20,000-fold magnification.
Figure 1B:
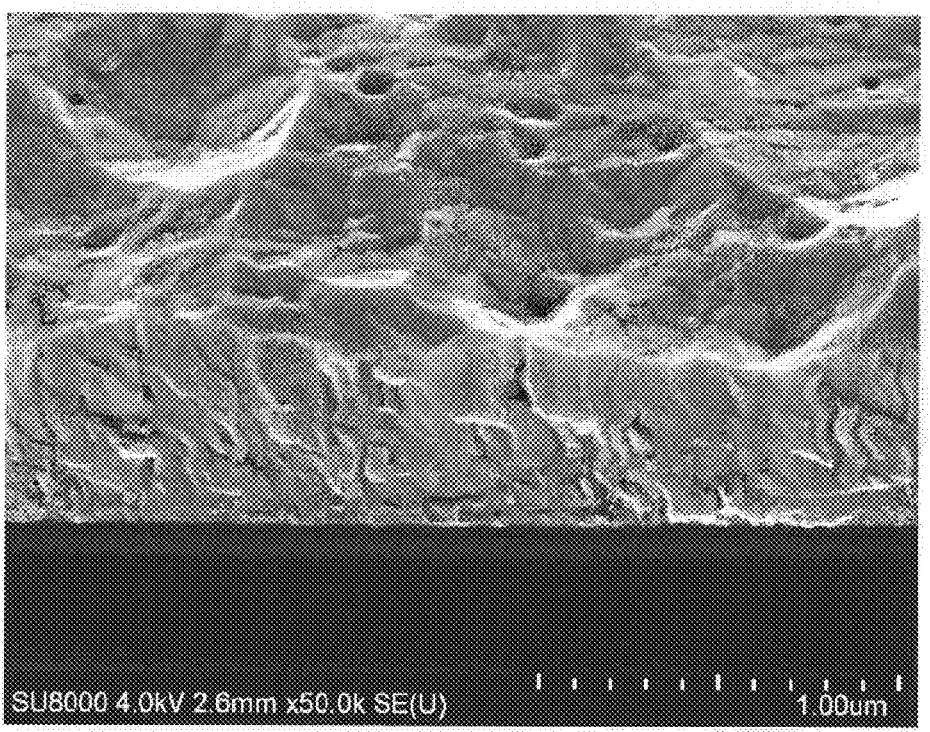
FIG. 1b presents a cut through the layer stack with a TCO layer according to the FIG. 1a with a 50,000-fold magnification.
Figure 2A:
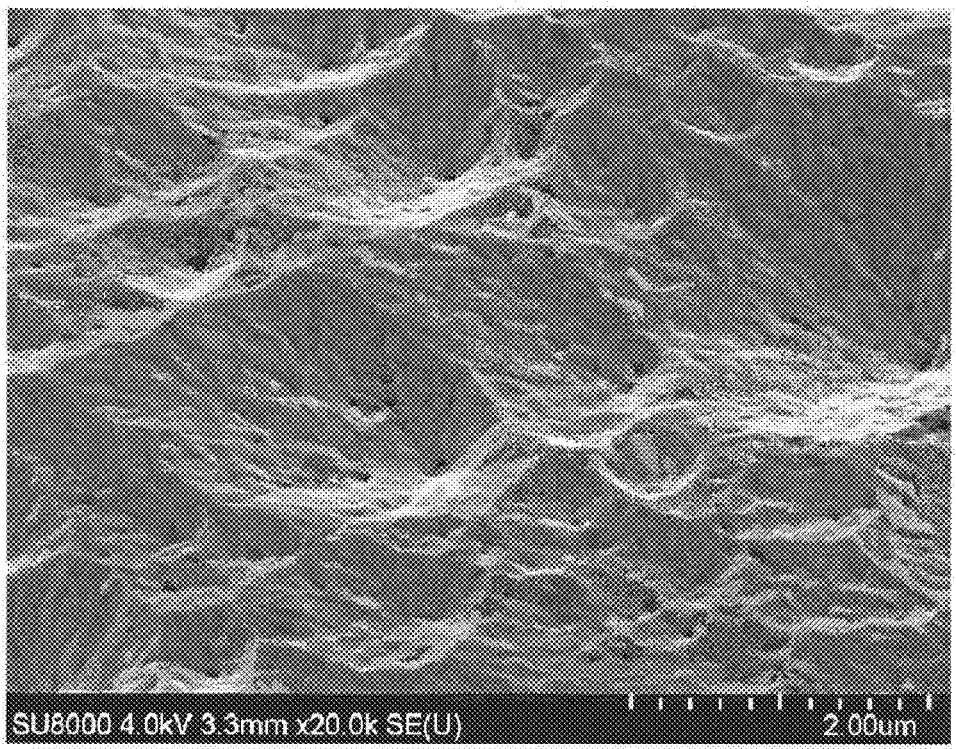
FIG. 2a presents the surface of another TCO layer with a 20,000-fold magnification.
Figure 2B:
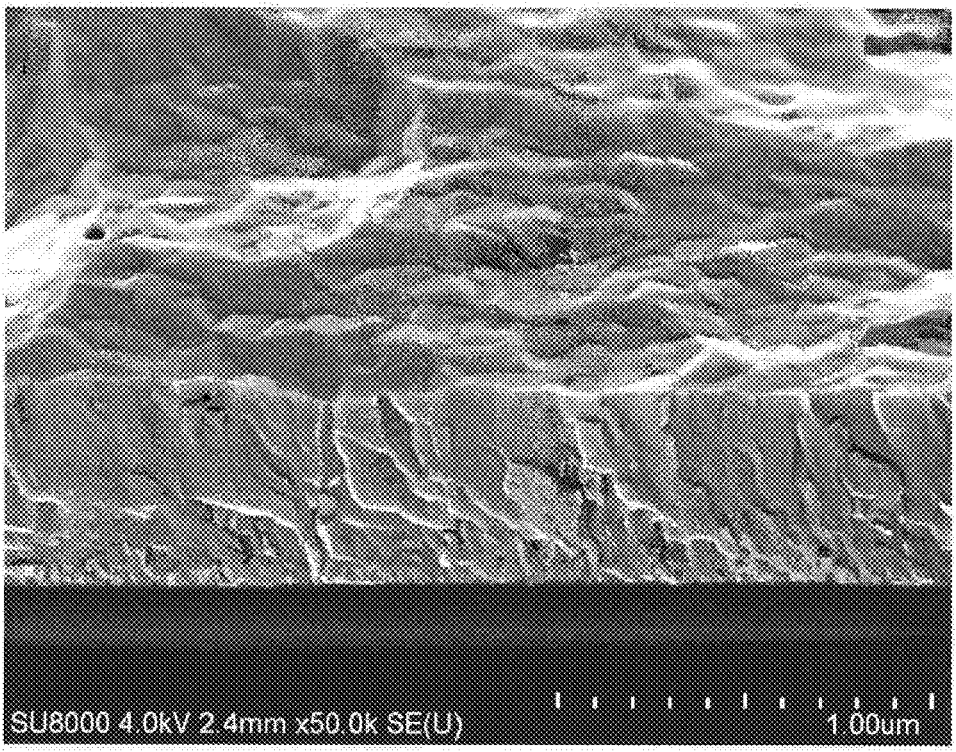
FIG. 2b presents a cut through the layer stack with the TCO layer according to FIG. 2a with a 50,000-fold magnification.

Both TCO layers of a similar thickness were deposited on a float glass substrate 1, on a silicon oxynitride barrier layer 2 and a silicon oxyntride seed layer 3. FIG. 1a shows the surface in 20,000-fold magnification and FIG. 1b shows a break through the layer stack in 50,000-fold magnification of the first TCO layer 4 which was deposited on a non-optimised seed layer 3, FIG. 2a and FIG. 2b show similar presentations of the second TCO layer 4 which was deposited on an optimised silicon oxynitride seed layer.

The directly on the float glass substrate 1 deposited dielectrical barrier layer 2 consists thereby in both instances of in the same conditions deposited sub-stiochiometric silicon oxynitride (SiOxNy). It operates as a barrier layer 2 for diffused sodium ions of the glasses in the layer system. With depositing of this barrier layer 2, the through the glass substrate additionally into the layer system introduced water can be removed from the substrate without this procedure having an impact on the subsequently established layer order. As besides the suitability as barrier layer 2, the material proves to be significantly insensitive toward water as the subsequent layers.

On top of the barrier layer 2, a seed layer 3 is deposited. Also for that purpose, a silicon oxynitride is deposited in both instances. The process parameters during the entire deposition in both instances do not vary in time however the reaction ratio was significantly changed from oxygen to nitrogen for depositing the seed layer 3 of the layer stack of FIGS. 2a and 2b in comparison to the seed layer 3 of the layer stack of FIGS. 1a and 1b. This leads to an increase of the lateral crystallite size of the subsequent TCO layer 4 in FIGS. 2a and 2b (under again same conditions as the TCO layer 4 of FIGS. 1a and 1b) of approximately 50% resulting in a respective increase of its haze value in particular after etching the TCO layer 4 following its deposition through the same etching process for both layers.

Figure 3:
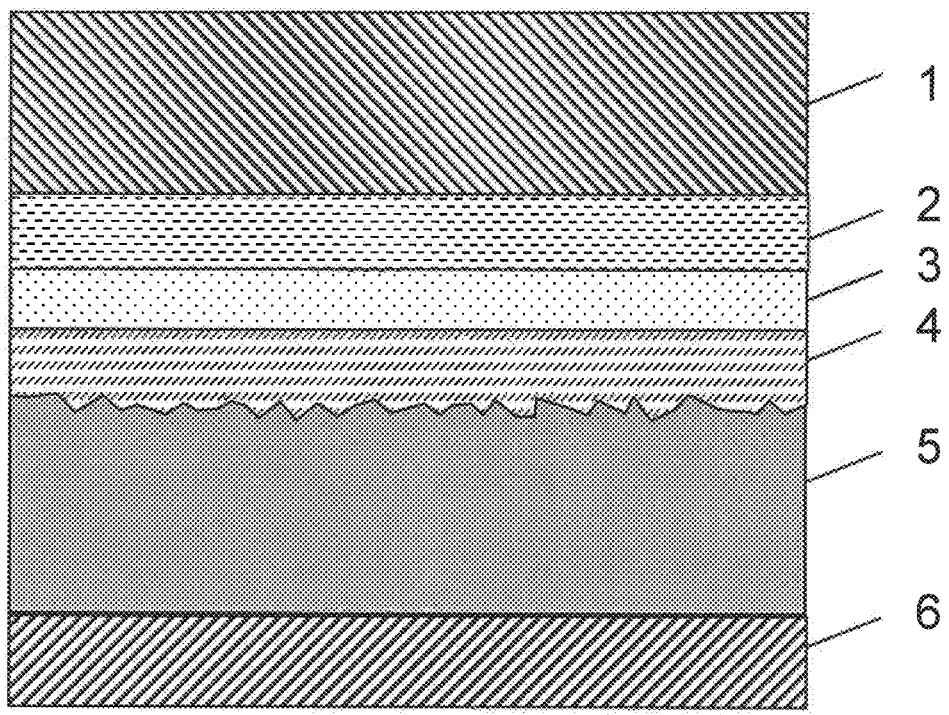
FIG. 3 presents the fundamental layer sequence of a thin-film solar cell using a TCO layer as a first contact layer.

If this TCO layer 4 is used as a front contact, the for a thin-film solar cell according to FIG. 3 known photoactive layer stack 5, which essentially has an absorber and whose detailed construction however can be differently realized and at the end is followed by a rear side contact 6, can subsequently be deposited.

The depositing at least of the barrier 2, the seed 3 and the TCO layers 4 takes place by sputtering in a continuous operation system. For manufacturing the subsequent photoactive layer stacks 5 which has the absorber and after that the rear side contact 6, it is referred to the known methods which are adapted to the respective order of layers.

The thin-film solar cell manufactured in this way on the layer stack of barrier layer 2, seed layer 3 and TCO layer 4 on the float glass substrate (FIG. 3) shows when layer stack of FIGS. 2a and 2b is used, a significantly greater efficiency than the thin-film solar cell manufactured on the layer stack of barrier layer 2, seed layer 3 and TCO layer 4 of FIGS. 1a and 1b on the float glass substrate 1.

The invention claimed is:

1. Method for coating of a substrate with a transparent conductive oxide (TCO) layer, comprising consecutively depositing on the substrate using physical vapor deposition:
   a barrier layer to avoid contamination of active layers through outwards diffusion of material from the substrate,
   a seed layer comprising an $SiO_xN_y$ or $SiO_x$ or $Si_xN_y$ with $0<x\leq3$ and $0<y\leq4$ on the barrier layer, and
   the TCO layer on the seed layer; and
   a step of setting a deposition condition for the seed layer to maximize lateral crystallite size of the TCO layer deposited on the seed layer.

2. The method according to claim 1, wherein the barrier layer comprises a $SiO_xN_y$ or $SiO_x$ or $Si_xN_y$ with $0<x\leq3$ and $0<y\leq4$.

3. The method according to claim 1, wherein the setting step comprises setting at least one of seed layer deposition process parameters and duration of parameter application to maximize the lateral crystallite size of the TCO layer.

4. The method according to claim 1, wherein the setting step comprises at least one of setting: a ratio of reactive gas components oxygen and nitrogen, ratio of the reactive gas components to sputtering components, pressure, and temperature so that a maximum lateral crystallite size of the TCO layer is attained.

5. The method according to claim 1, wherein the setting step comprises alternating between a seed layer growth phase, a seed layer resting phase and/or a seed layer resputter phase during the deposition of the seed layer.

6. The method according to claim 1, wherein after deposition of the TCO layer, a surface of the TCO layer is textured and/or roughened.

7. The method according to claim 2, wherein deposition conditions of the barrier layer and the seed layer differ by depletion or enhancement of at least one of oxygen level and nitrogen level.

8. The method according to claim 1, wherein the TCO layer serves as a first contact layer, and further comprising: depositing, on the TCO layer, a photoactive layer stack and a counter contact that serves as a second contact, whereby a thin-film solar cell is formed.

* * * * *